(12) United States Patent
Hsieh et al.

(10) Patent No.: US 11,175,312 B2
(45) Date of Patent: Nov. 16, 2021

(54) STAGGERED PROBE CARD

(71) Applicant: CHUNGHWA PRECISION TEST TECH. CO., LTD., Taoyuan (TW)

(72) Inventors: Kai-Chieh Hsieh, Taoyuan (TW); Hsiao-Kang Li, Keelung (TW); Ying-Ming Tiao, Kaohsiung (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 122 days.

(21) Appl. No.: 16/735,706

(22) Filed: Jan. 7, 2020

(65) Prior Publication Data
US 2021/0109129 A1 Apr. 15, 2021

(30) Foreign Application Priority Data
Oct. 14, 2019 (TW) .................................. 108136831

(51) Int. Cl.
*G01R 1/073* (2006.01)
*G01R 1/067* (2006.01)

(52) U.S. Cl.
CPC ..... *G01R 1/07342* (2013.01); *G01R 1/06705* (2013.01)

(58) Field of Classification Search
CPC ...... G01R 1/06722; G01R 1/06; G01R 1/067; G01R 1/06705; G01R 1/06711; G01R 1/06716; G01R 1/06727; G01R 1/06733; G01R 1/06738; G01R 1/06744; G01R 1/0675; G01R 1/06755; G01R 1/06761; G01R 1/06766; G01R 1/06772; G01R 1/06777; G01R 1/073; G01R 1/07307; G01R 1/07314; G01R 1/07321; G01R 1/07328; G01R 1/07335; G01R 1/07342; G01R 1/0735; G01R 1/07357; G01R 1/07364; G01R 1/07371; G01R 1/07378; G01R 1/07385; G01R 1/07392
See application file for complete search history.

(56) References Cited

U.S. PATENT DOCUMENTS

| 5,220,278 | A  | * | 6/1993 | Sekii .................. | G01R 1/07342 |
| | | | | | 324/756.03 |
| 2007/0167022 | A1 | * | 7/2007 | Tsai ......................... | G01R 3/00 |
| | | | | | 438/712 |
| 2010/0176832 | A1 | * | 7/2010 | Kister ................ | G01R 1/07314 |
| | | | | | 324/756.07 |

* cited by examiner

*Primary Examiner* — Lee E Rodak
*Assistant Examiner* — Brent J Andrews
(74) *Attorney, Agent, or Firm* — Li & Cai Intellectual Property Office

(57) ABSTRACT

A staggered probe card and a conductive probe are provided. The staggered probe card includes an upper guide board, a lower guide board spaced apart from the upper guide board, and a plurality of conductive probes arranged in rows and passing through the upper and lower guide boards. Each of the conductive probes has an elongated structure defining a longitudinal direction, and includes a bottom surface and two long side surfaces respectively connected to two edges of the bottom surface. A distance between the two long side surfaces gradually decreases in a tapering direction that extends away from the bottom surface. In two of the rows of the conductive probes adjacent to each other, any two long side surfaces respectively belonging to the two adjacent rows and arranged adjacent to each other have a lateral interval along a direction that is non-parallel to the arrangement direction.

7 Claims, 7 Drawing Sheets

STAGGERED PROBE CARD

CROSS-REFERENCE TO RELATED PATENT APPLICATION

This application claims the benefit of priority to Taiwan Patent Application No. 108136831, filed on Oct. 14, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a staggered probe card and a conductive probe.

BACKGROUND OF THE DISCLOSURE

A conventional probe card includes a plurality of conductive probes arranged in rows, and each of the rows of the conductive probes is parallel to an arrangement direction for abutting against a row of metal pads of a device under test (DUT). However, in the conductive probes of each of the rows, any two of the conductive probes adjacent to each other need to maintain a predetermined space there-between along the arrangement direction, so that the structural design of the conventional probe card is limited.

SUMMARY OF THE DISCLOSURE

In response to the above-referenced technical inadequacies, the present disclosure provides a staggered probe card and a conductive probe to effectively improve the issues associated with conventional probe cards.

In one aspect, the present disclosure provides a staggered probe card, which includes an upper guide board, a lower guide board spaced apart from the upper guide board, and a plurality of conductive probes. Each of the conductive probes has an elongated shape defining a longitudinal direction. The conductive probes pass through the upper guide board and the lower guide board, the conductive probes are arranged in a plurality of rows, and each of the rows of the conductive probes is parallel to an arrangement direction. Each of the conductive probes includes a bottom surface and two long side surfaces respectively connected to two edges of the bottom surface. In each of the conductive probes, the bottom surface is parallel to the longitudinal direction and passes through the upper guide board and the lower guide board, the two long side surfaces are parallel to the longitudinal direction and pass through the upper guide board and the lower guide board, and a distance between the two long side surfaces gradually decreases along a tapering direction that extends away from the bottom surface. In two of the rows of the conductive probes adjacent to each other, the conductive probes of one of the two of the rows are spaced apart from and staggered with those of the other one of the two of the rows, the tapering direction defined by any one of the conductive probes of one of the two of the rows extends oppositely to the tapering direction defined by any one of the conductive probes of the other one of the two of the rows, and any two of the long side surfaces respectively belonging to the two of the rows and adjacent to each other have a lateral interval there-between along a direction that is non-parallel to the arrangement direction.

In one aspect, the present disclosure provides a conductive probe having an elongated shape defining a longitudinal direction. The conductive probe includes a bottom surface parallel to the longitudinal direction and two long side surfaces respectively connected to two edges of the bottom surface. The two long side surfaces are parallel to the longitudinal direction, and a distance between the two long side surfaces gradually decreases along a tapering direction that extends away from the bottom surface.

Therefore, the staggered probe card of the present disclosure is formed with a new structure different from that of the conventional probe cards by the structural design of each of the conductive probes. Specifically, any two of the rows of the conductive probes adjacent to each other can be spaced apart from and staggered with each other, and a predetermined space between any two of the conductive probes adjacent to each other is implemented by the lateral interval along the direction that is non-parallel to the arrangement direction.

Moreover, regions of the upper guide board and the lower guide board provided for the conductive probes to pass through can be effectively increased by the structural design of each of the conductive probes, so that an area of the cross section of the conductive probe can be greater than that of the conventional probe. Accordingly, the amount of current transmission of the conductive probe can be increased for improving the contact stability between the conductive probe and the DUT.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
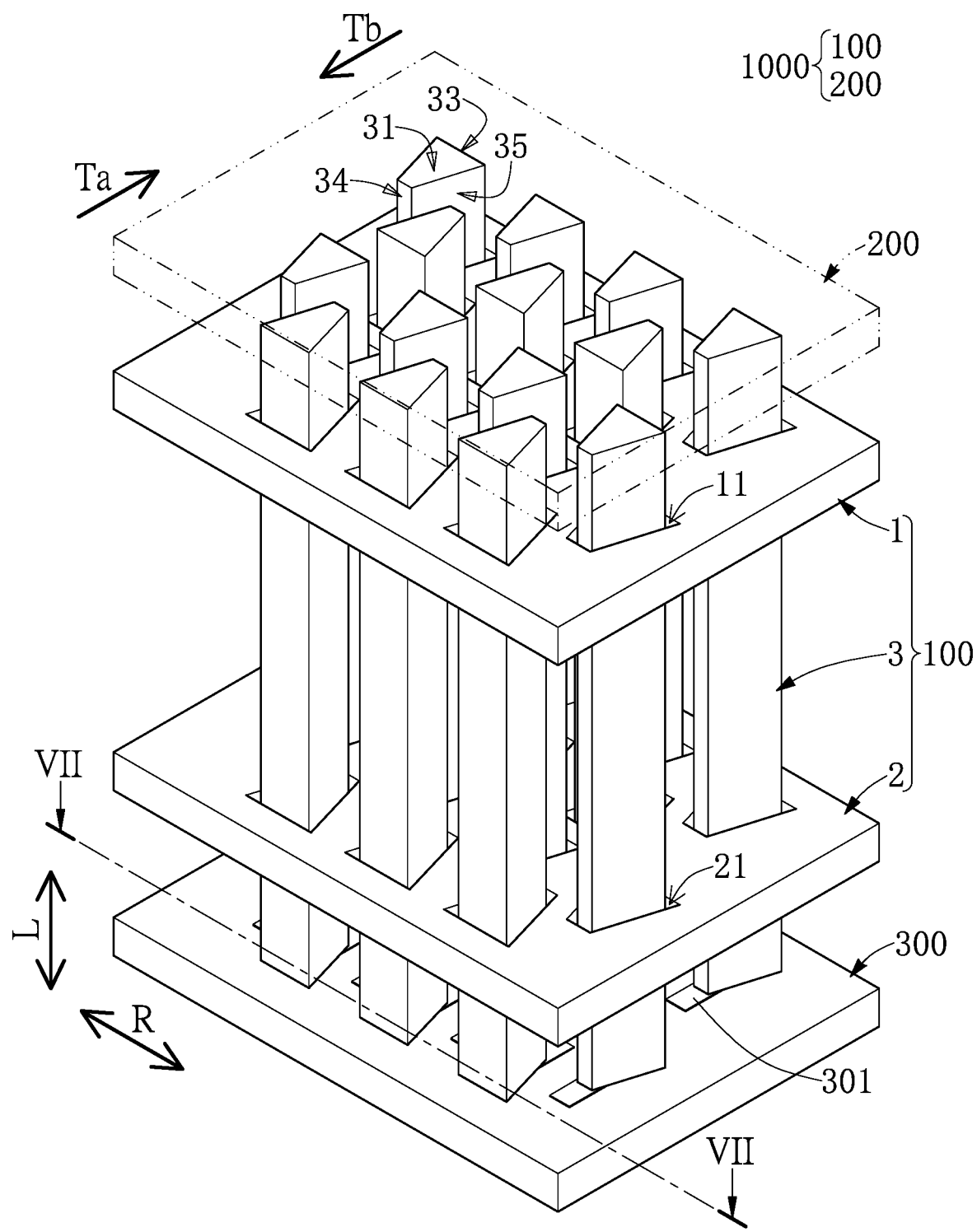
FIG. 1 is a perspective view of a staggered probe card according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 7, a first embodiment of the present disclosure provides a staggered probe card 1000. As shown in FIG. 1, the staggered probe card 1000 includes a probe head 100 and a space transformer 200 abutted against one side of the probe head 100 (e.g., the top side of the probe head 100 shown in FIG. 1). The other side of the probe head 100 (e.g., the bottom side of the probe head 100 shown in FIG. 1) is configured to abut against and test a DUT 300 (e.g., a semiconductor wafer) having a plurality of metal pads 301 arranged in rows.

It should be noted that part of the drawings of the present embodiment are cross-sectional views in order to more easily describe the structure and connection relationship of each component of the staggered probe card 1000 of the present embodiment, but the present disclosure is not limited by the drawings. The following description describes the structure and connection relationship of each component of the probe head 100.

As shown in FIG. 1, the probe head 100 includes an upper guide board 1, a lower guide board 2 spaced apart from the upper guide board 1, a spacer (not shown) sandwiched between the upper guide board 1 and the lower guide board 2, and a plurality of conductive probes 3 passing through the upper guide board 1 and the lower guide board 2. Specifically, the upper guide board 1 has a plurality of upper thru-holes 11, the lower guide board 2 has a plurality of lower thru-holes 21, and the lower thru-holes 21 respectively correspond in position to the upper thru-holes 11. The spacer in the present embodiment is sandwiched between the upper guide board 1 and the lower guide board 2, so that the upper guide board 1 and the lower guide board 2 can be spaced apart from and parallel to each other, but the present disclosure is not limited thereto.

Moreover, the spacer can be an annular structure sandwiched between peripheral portions of the upper guide board 1 and the lower guide board 2, and the spacer has an accommodating space in spatial communication with the upper thru-holes 11 and the lower thru-holes 21, but the present disclosure is not limited thereto. For example, in other embodiments of the present disclosure, the spacer of the probe head 100 can be omitted or can be replaced by other components.

When the upper guide board 1 and the lower guide board 2 are not in a staggered arrangement, the conductive probes 3 respectively and movably pass through the upper thru-holes 11 of the upper guide board 1, and respectively and movably pass through the lower thru-holes 21 of the lower guide board 2. Moreover, when the upper guide board 1 and the lower guide board 2 are in the staggered arrangement (not shown), each of the conductive probes 3 is positioned by the upper guide board 1 and the lower guide board 2 so as to be in a bent shape.

Each of the conductive probes 3 has an elongated shape defining a longitudinal direction L. The conductive probes 3 are arranged in a plurality of rows, and each of the rows of the conductive probes 3 is parallel to an arrangement direction R. It should be noted that the conductive probe 3 in the present embodiment is described in cooperation with the upper guide board 1 and the lower guide board 2, but the present disclosure is not limited thereto. For example, in other embodiments of the present disclosure, the conductive probe 3 can be independently used (e.g., sold) or can be used in cooperation with other components.

As the conductive probes 3 of the present embodiment are of the same structure, the following description discloses the structure of just one of the conductive probes 3 for the sake of brevity, but the present disclosure is not limited thereto. For example, in other embodiments of the present disclosure, the conductive probes 3 of the probe head 100 may be formed of different structures.

As shown in FIG. 1 to FIG. 3, and FIG. 7, the conductive probe 3 in the present embodiment is a straight structure that is flexible and electrically conductive. An outer surface of the conductive probe 3 includes a fixing end surface 31, a testing end surface 32, a bottom surface 33, a top surface 34, and two long side surfaces 35. The fixing end surface 31 and the testing end surface 32 are respectively arranged on two opposite ends of the conductive probe 3. The bottom surface 33, the top surface 34, and the two long side surfaces 35 are arranged between the fixing end surface 31 and the testing end surface 32. Moreover, the fixing end surface 31 and the testing end surface 32 are substantially perpendicular to the longitudinal direction L, and the bottom surface 33, the top surface 34, and the two long side surfaces 35 are parallel to the longitudinal direction L and pass through the upper guide board 1 and the lower guide board 2.

Specifically, the two long side surfaces 35 are respectively connected to two edges of the bottom surface 33, and are respectively connected to two edges of the top surface 34. A distance between the two long side surfaces 35 gradually decreases along a tapering direction Ta, Tb that extends away from the bottom surface 33. The two long side surfaces 35 can be flat surfaces, and the tapering direction Ta, Tb and any one of the two long side surfaces 35 define an angle α there-between that is preferable within a range of 95-135 degrees, but the angle α can be adjusted or changed according to design requirements. In other words, any portion of the conductive probe 3 has a cross section perpendicular to the longitudinal direction L, and the cross section is in a substantially trapezoidal shape (as shown in FIG. 3), but the present disclosure is not limited thereto.

Figure 4:
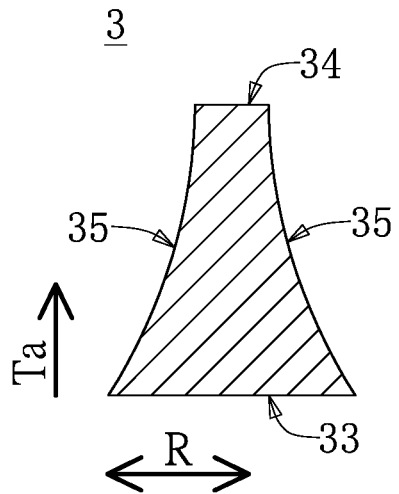
FIG. 4 is a cross-sectional view showing another configuration of FIG. 3.
Figure 5:
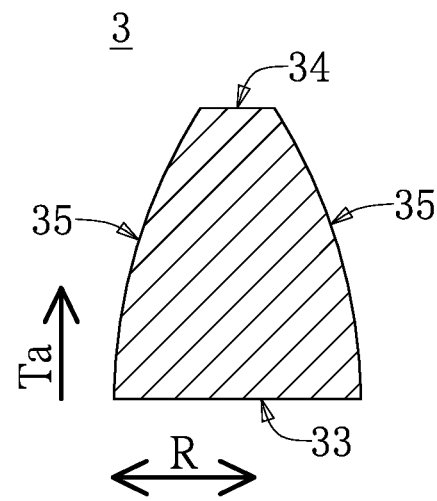
FIG. 5 is a cross-sectional view showing still another configuration of FIG. 3.
Figure 6:
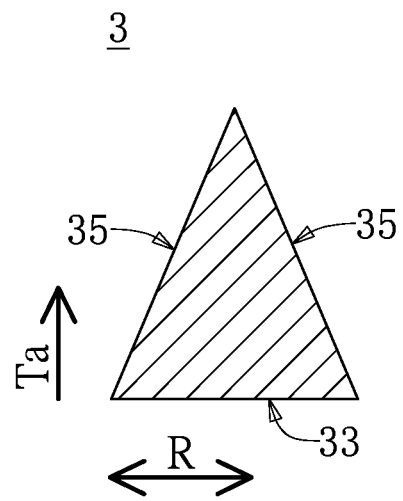
FIG. 6 is a cross-sectional view showing yet another configuration of FIG. 3.

For example, the two long side surfaces 35 of the conductive probe 3 can be concave surfaces shown in FIG. 4 or convex surfaces shown in FIG. 5. Moreover, the cross section of any portion of the conductive probe 3 perpendicular to the longitudinal direction L can be a substantially triangular shape (as shown in FIG. 6). In other words, the conductive probe 3 can be formed without the top surface 34, and the two long side surfaces 35 are connected to each other. Furthermore, in other embodiments of the present disclosure, the top surface 34 can be a curved surface.

Figure 2:
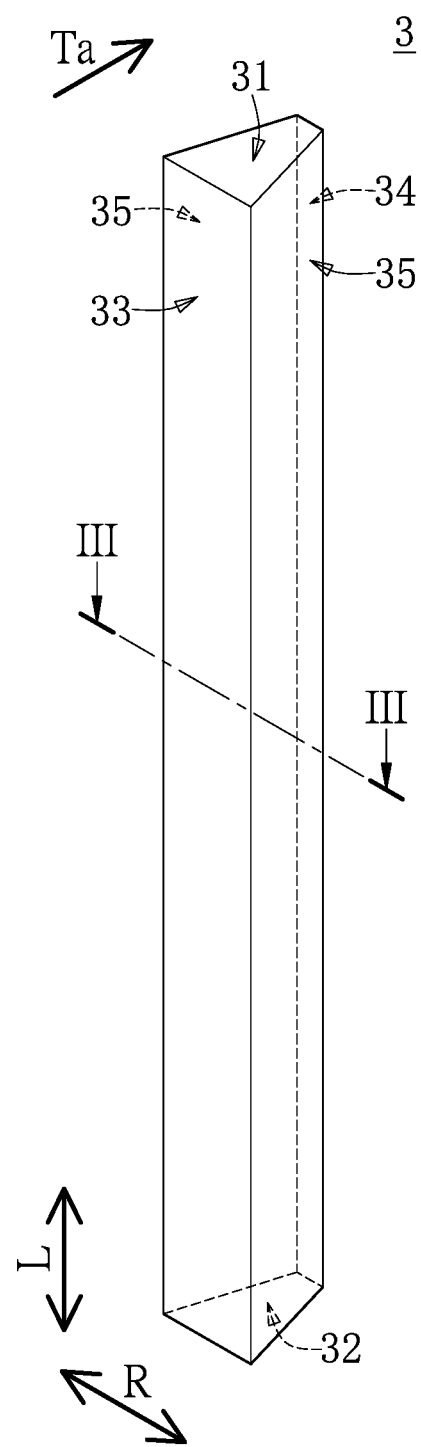
FIG. 2 is a perspective view of a conductive probe according to the first embodiment of the present disclosure.
Figure 3:
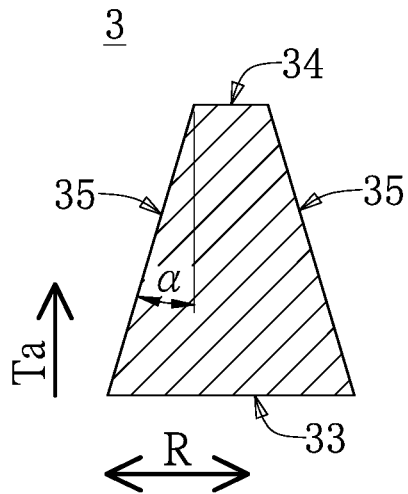
FIG. 3 is a cross-sectional view taken along line III-III of FIG. 2.

As shown in FIG. 1 to FIG. 3, the fixing end surface 31 of the conductive probe 3 is fixed to the space transformer 200, and the testing end surface 32 of the conductive probe 3 is configured to detachably abut against one of the metal pads 301 of the DUT 300. Moreover, the shape of the fixing end surface 31 and the shape of the testing end surface 32 in the present embodiment each can be identical to that of the cross section of any portion of the conductive probe 3, but the present disclosure is not limited thereto. For example, the shape of the testing end surface 32 can be different from that of the cross section of any portion of the conductive probe 3.

In addition, each of the lower thru-holes 21 of the lower guide board 2 in the present embodiment corresponds in shape to the cross section of any portion of the corresponding conductive probe 3, so that when the upper guide board 1 and the lower guide board 2 are moved toward the staggered arrangement (not shown), the conductive probes 3 can be bent toward the same side, but the present disclosure is not limited thereto. For example, in other embodiments of the present disclosure, the lower thru-hole 21 does not correspond in shape to the cross section of any portion of the conductive probe 3, but the conductive probes 3 can be still bent toward the same side. Moreover, the upper thru-hole 11 of the present embodiment can correspond in shape to the cross section of any portion of the conductive probe 3.

Figure 7:
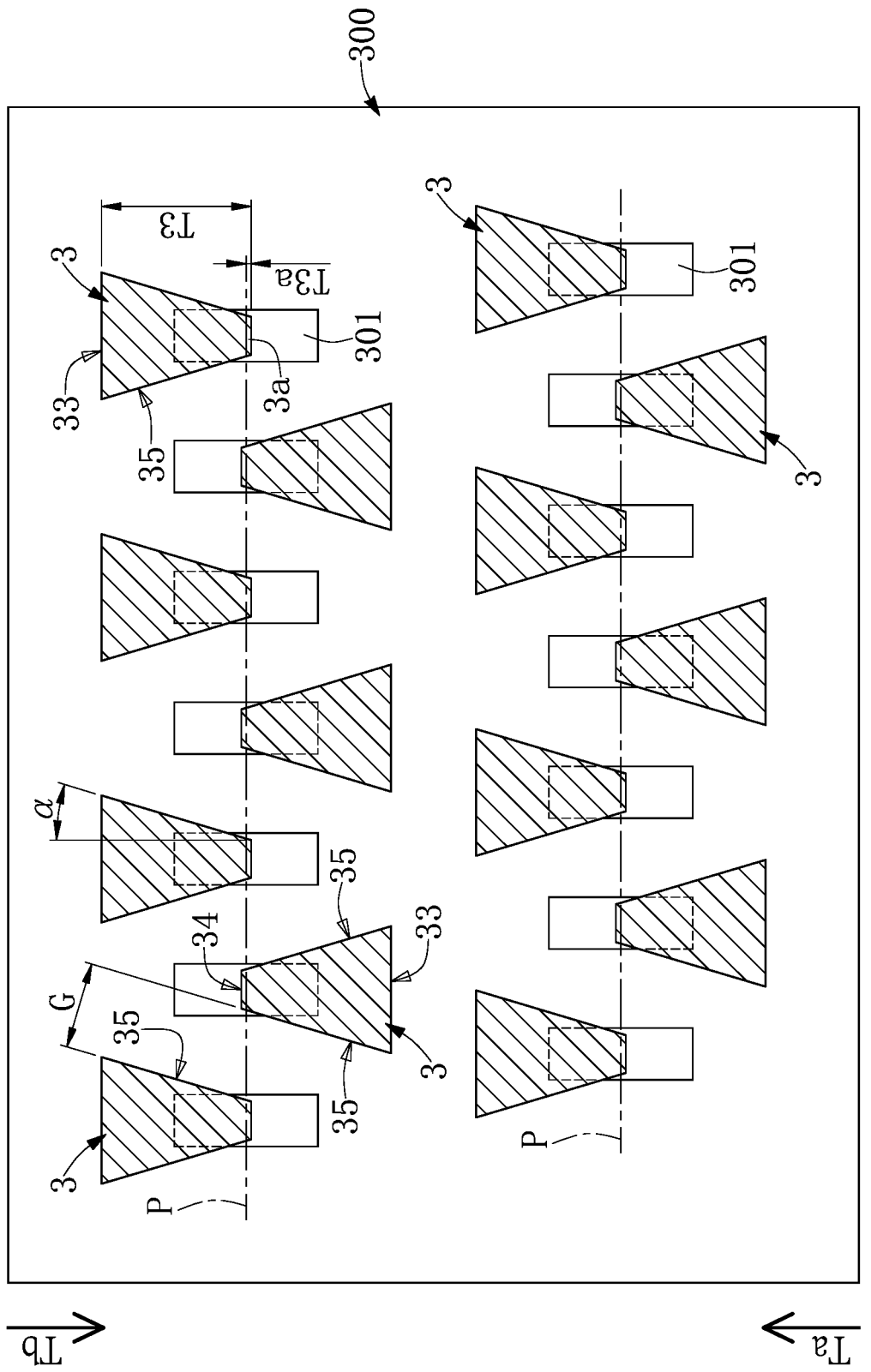
FIG. 7 is a cross-sectional view taken along line VII-VII of FIG. 1.

The above description describes the structure of the conductive probe 3, and the following description describes the connection relationship of the components of the staggered probe card 1000. As shown in FIG. 1 and FIG. 7, in two of the rows of the conductive probes 3 adjacent to each other (e.g., the upper two rows shown in FIG. 7), the conductive probes 3 of one of the two of the rows are spaced apart from and staggered with those of the other one of the two of the rows, the tapering direction Ta defined by any one of the conductive probes 3 of one of the two of the rows extends oppositely to the tapering direction Tb defined by any one of the conductive probes 3 of the other one of the two of the rows, and any two of the long side surfaces 35 respectively belonging to the two of the rows and adjacent to each other have a lateral interval G there-between along a direction that is non-parallel to the arrangement direction R.

In the present embodiment, the testing end surfaces 32 of the conductive probes 3 of the two of the rows (e.g., the upper two rows shown in FIG. 7) are configured to detachably abut against one of the rows of metal pads 301 of the DUT 300. In other words, any two rows of conductive probes abutting against more than one row of metal pads of DUT are different from the two of the rows of the conductive probes 3 of the present embodiment that are spaced apart from and staggered with each other.

Accordingly, the staggered probe card 1000 of the present disclosure is formed with a new structure different from that of the conventional probe cards by the structural design of each of the conductive probes 3. Specifically, any two of the rows of the conductive probes 3 adjacent to each other can be spaced apart from and staggered with each other, and a predetermined space between any two of the conductive probes 3 adjacent to each other is implemented by the lateral interval G along the direction that is non-parallel to the arrangement direction R.

Moreover, regions of the upper guide board 1 and the lower guide board 2 provided for the conductive probes to pass through can be effectively increased by the structural design of each of the conductive probes 3, so that an area of the cross section of the conductive probe 3 can be greater than that of the conventional probe. Accordingly, the amount of current transmission of the conductive probe 3 can be increased for improving the contact stability between the conductive probe 3 and the DUT 300.

In addition, in the two of the rows of the conductive probes 3 (e.g., the upper two rows shown in FIG. 7) that are spaced apart from and staggered with each other, the bottom surfaces 33 defines a central plane P there-between, the central plane P is parallel to the arrangement direction R and is spaced apart from each of the bottom surfaces 33 by the same distance, and each of the conductive probes 3 has a top end portion 3a arranged at a side of the central plane P that is distant to the bottom surface 33 thereof. In other words, the conductive probes 3 in the two of the rows adjacent to each other are partially overlapped with each other along the arrangement direction R. Specifically, each of the conductive probes 3 has a total thickness T3 along the tapering direction Ta, Tb, and in each of the conductive probes 3, a thickness T3a of the top end portion 3a along the tapering direction Ta, Tb is preferable 3%-10% of the total thickness T3, but the present disclosure is not limited thereto.

Accordingly, since the conductive probes 3 in the two of the rows adjacent to each other are partially overlapped with each other along the arrangement direction R, the distribution density of the conductive probes 3 of the staggered probe card 1000 can be increased.

Second Embodiment

Figure 8:
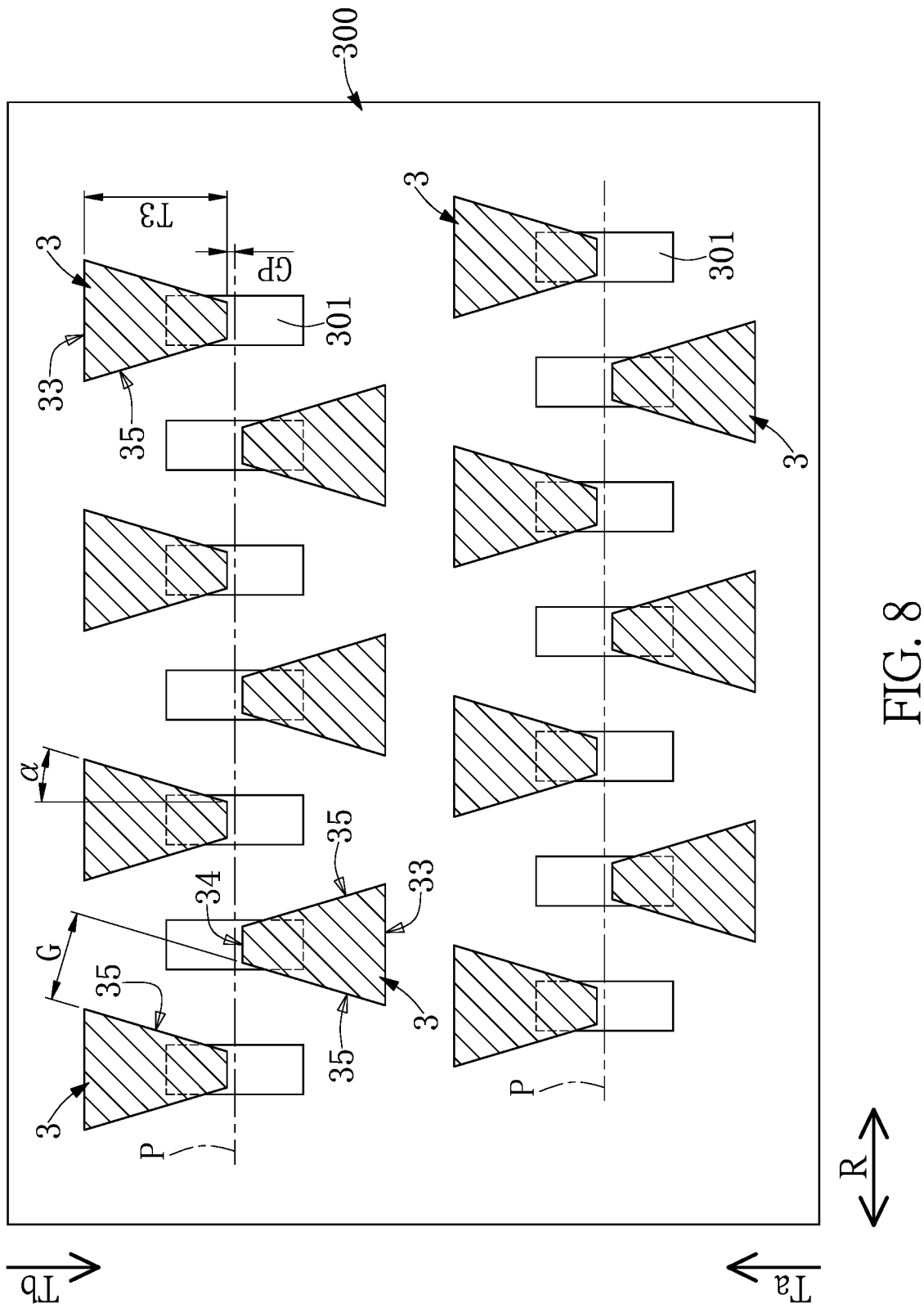
FIG. 8 is a cross-sectional view of a staggered probe card according to a second embodiment of the present disclosure.

Referring to FIG. 8, a second embodiment of the present disclosure is similar to the first embodiment of the present disclosure. For the sake of brevity, descriptions of the same components in the first and second embodiments of the present disclosure will be omitted, and the following description only discloses different features between the first and second embodiments.

In the two of the rows of the conductive probes 3 of the present embodiment (e.g., the upper two rows shown in FIG. 8) that are spaced apart from and staggered with each other, the bottom surfaces 33 define a central plane P there-between, the central plane P is parallel to the arrangement direction R and is spaced apart from each of the bottom surfaces 33 by the same distance, and the central plane P does not pass through each of the conductive probes 3. In other words, the conductive probes 3 in the two of the rows adjacent to each other are not overlapped with each other along the arrangement direction R.

Specifically, each of the conductive probes 3 is spaced apart from the central plane P by a spacing GP that is less than 5% of the total thickness T3, but the present disclosure is not limited thereto.

Third Embodiment

Figure 9:
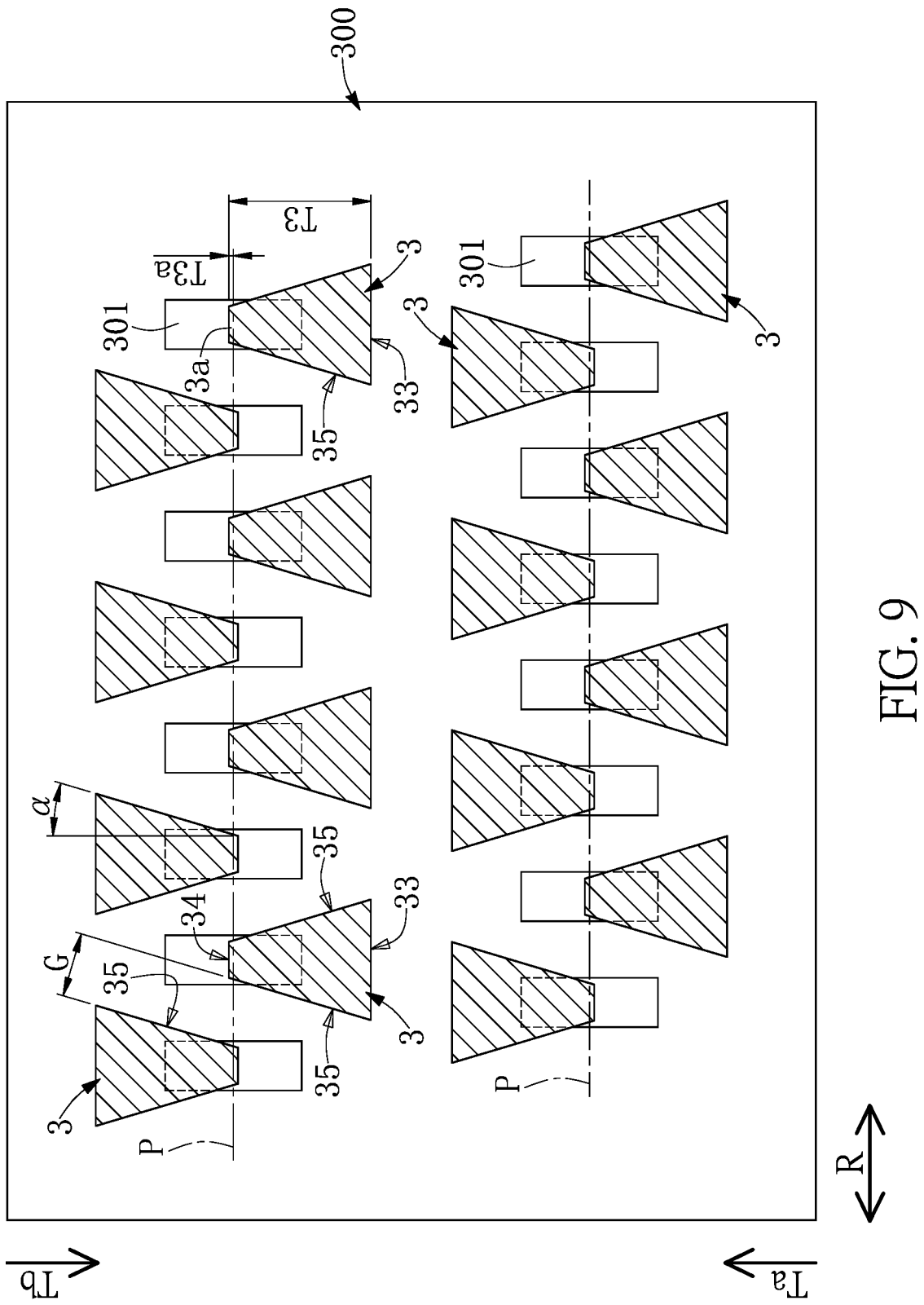
FIG. 9 is a cross-sectional view of a staggered probe card according to a third embodiment of the present disclosure.

Referring to FIG. 9, a third embodiment of the present disclosure is similar to the first embodiment of the present disclosure. For the sake of brevity, descriptions of the same components in the first and third embodiments of the present disclosure will be omitted, and the following description only discloses different features between the first and third embodiments.

In the two of the rows of the conductive probes 3 of the present embodiment (e.g., the upper two rows shown in FIG. 9) that are spaced apart from and staggered with each other, the two edges of the bottom surface 33 of any one of the conductive probes 3 of one of the two of the rows respectively face (or overlap with) the bottom surfaces 33 of two of the conductive probes 3 of the other one of the two of the rows along a direction parallel to the tapering direction Ta, Tb, so that the distribution density of the conductive probes 3 of the staggered probe card 1000 can be effectively increased.

Fourth Embodiment

Figure 10:
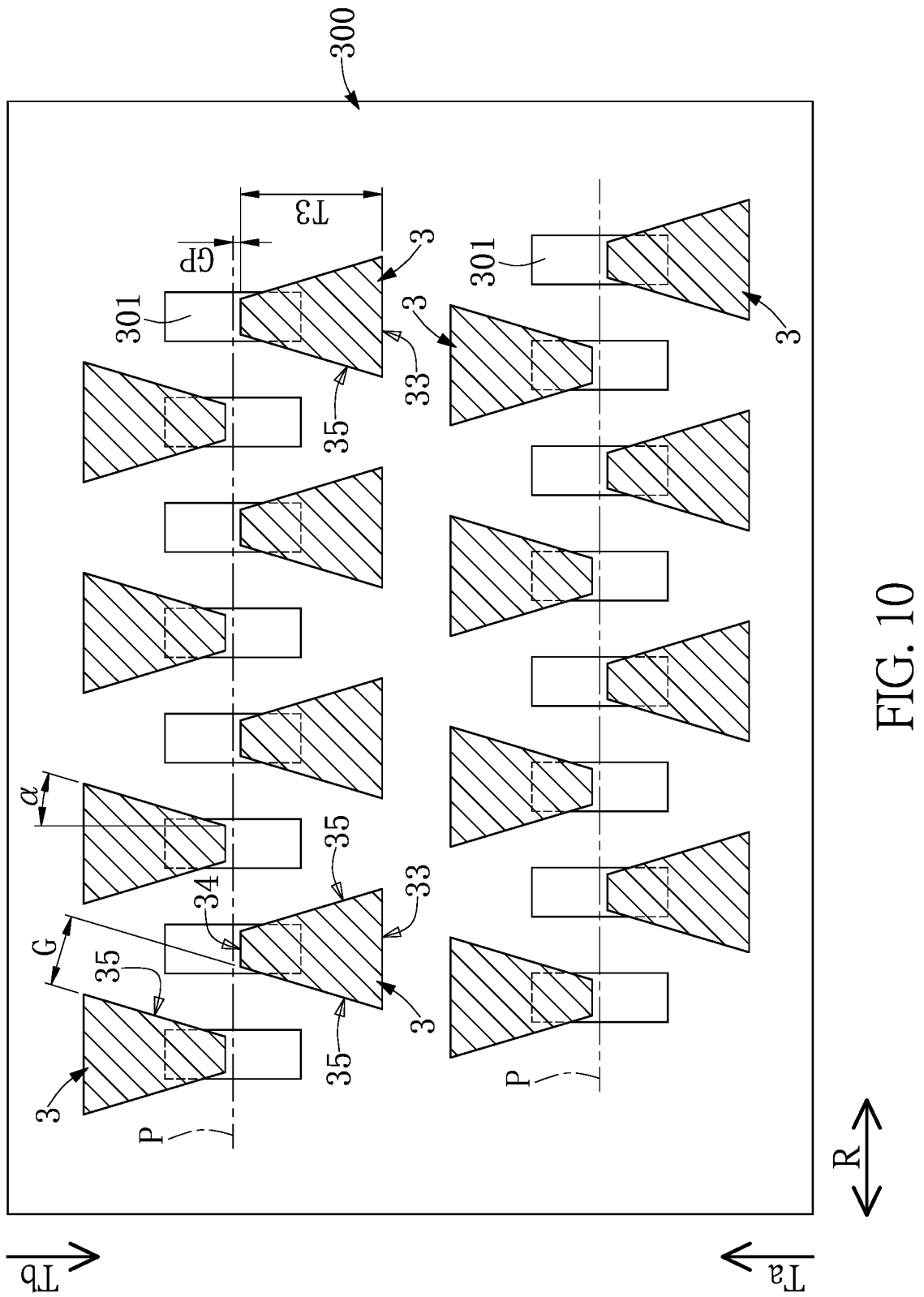
FIG. 10 is a cross-sectional view of a staggered probe card according to a fourth embodiment of the present disclosure.

Referring to FIG. 10, a fourth embodiment of the present disclosure is similar to the second embodiment of the present disclosure. For the sake of brevity, descriptions of the same components in the second and fourth embodiments of the present disclosure will be omitted, and the following description only discloses different features between the second and fourth embodiments.

In the two of the rows of the conductive probes 3 of the present embodiment (e.g., the upper two rows shown in FIG. 9) that are spaced apart from and staggered with each other, the two edges of the bottom surface 33 of any one of the conductive probes 3 of one of the two of the rows respectively face (or overlap with) the bottom surfaces 33 of two of the conductive probes 3 of the other one of the two of the rows along a direction parallel to the tapering direction Ta, Tb, so that the distribution density of the conductive probes 3 of the staggered probe card 1000 can be effectively increased.

In conclusion, the staggered probe card of the present disclosure is formed with a new structure different from that of the conventional probe cards by the structural design of each of the conductive probes. Specifically, any two of the rows of the conductive probes adjacent to each other can be spaced apart from and staggered with each other, and a predetermined space between any two of the conductive probes adjacent to each other is implemented by the lateral interval along the direction that is non-parallel to the arrangement direction.

Moreover, regions of the upper guide board and the lower guide board provided for the conductive probes to pass through can be effectively increased by the structural design of each of the conductive probes, so that an area of the cross section of the conductive probe can be greater than that of the conventional probe. Accordingly, the amount of current transmission of the conductive probe can be increased for improving the contact stability between the conductive probe and the DUT.

In addition, the conductive probes in the two of the rows adjacent to each other are partially overlapped with each other along the arrangement direction, or the two edges of the bottom surface of any one of the conductive probes 3 of one of the two of the rows respectively face the bottom surfaces of two of the conductive probes of the other one of the two of the rows along a direction parallel to the tapering direction, so that the distribution density of the conductive probes of the staggered probe card can be effectively increased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A staggered probe card, comprising:
   an upper guide board and a lower guide board that is spaced apart from the upper guide board; and
   a plurality of conductive probes each having an elongated shape defining a longitudinal direction, wherein the conductive probes pass through the upper guide board and the lower guide board, the conductive probes are arranged in a plurality of rows, and each of the rows of the conductive probes is parallel to an arrangement direction, and wherein each of the conductive probes includes:
      a bottom surface parallel to the longitudinal direction and passing through the upper guide board and the lower guide board; and
      two long side surfaces respectively connected to two edges of the bottom surface,
   wherein the two long side surfaces are parallel to the longitudinal direction and pass through the upper guide board and the lower guide board, and wherein a distance between the two long side surfaces gradually decreases along a tapering direction that extends away from the bottom surface,
   wherein in two of the rows of the conductive probes adjacent to each other, the conductive probes of one of the two of the rows are spaced apart from and staggered with those of the other one of the two of the rows, the tapering direction defined by any one of the conductive probes of one of the two of the rows extends oppositely to the tapering direction defined by any one of the conductive probes of the other one of the two of the rows, and any two of the long side surfaces respectively belonging to the two of the rows and adjacent to each other have a lateral interval there-between along a direction that is non-parallel to the arrangement direction;
   wherein in the two of the rows of the conductive probes, the bottom surfaces define a central plane there-between, the central plane is parallel to the arrangement direction and is spaced apart from each of the bottom surfaces by the same distance, and each of the conductive probes has a top end portion arranged at a side of the central plane that is distant to the bottom surface thereof.

2. The staggered probe card according to claim 1, wherein each of the conductive probes includes a testing end surface, the testing end surfaces of the conductive probes of the two of the rows are configured to detachably abut against a row of metal pads of a device under test (DUT), and wherein any portion of each of the conductive probes has a cross section being perpendicular to the longitudinal direction and having a shape identical to that of the testing end surface.

3. The staggered probe card according to claim 1, wherein the upper guide board has a plurality of upper thru-holes, the lower guide board has a plurality of lower thru-holes, and the conductive probes respectively and movably pass through the upper thru-holes of the upper guide board and respectively and movably pass through the lower thru-holes of the lower guide board, and wherein each of the lower thru-holes corresponds in shape to a cross section of any portion of the corresponding conductive probe perpendicular to the longitudinal direction.

4. The staggered probe card according to claim 1, wherein each of the conductive probes has a top surface arranged away from the bottom surface and connected to the two long side surfaces, and the two long side surfaces of each of the conductive probes are flat surfaces, concave surfaces, or convex surfaces.

5. The staggered probe card according to claim 1, wherein in each of the conductive probes, the tapering direction and any one of the two long side surfaces define an angle there-between that is within a range of 95-135 degrees, and wherein in the two of the rows of the conductive probes, the two edges of the bottom surface of any one of the conductive probes of one of the two of the rows respectively face the bottom surfaces of two of the conductive probes of the other one of the two of the rows along a direction parallel to the tapering direction.

6. The staggered probe card according to claim 1, wherein each of the conductive probes has a total thickness in the tapering direction, and wherein in each of the conductive probes, a thickness of the top end portion in the tapering direction is 3%-10% of the total thickness.

7. A staggered probe card, comprising:
an upper guide board and a lower guide board that is spaced apart from the upper guide board; and
a plurality of conductive probes each having an elongated shape defining a longitudinal direction, wherein the conductive probes pass through the upper guide board and the lower guide board, the conductive probes are arranged in a plurality of rows, and each of the rows of the conductive probes is parallel to an arrangement direction, and wherein each of the conductive probes includes:
a bottom surface parallel to the longitudinal direction and passing through the upper guide board and the lower guide board; and
two long side surfaces respectively connected to two edges of the bottom surface, wherein the two long side surfaces are parallel to the longitudinal direction and pass through the upper guide board and the lower guide board, and wherein a distance between the two long side surfaces gradually decreases along a tapering direction that extends away from the bottom surface,
wherein in two of the rows of the conductive probes adjacent to each other, the conductive probes of one of the two of the rows are spaced apart from and staggered with those of the other one of the two of the rows, the tapering direction defined by any one of the conductive probes of one of the two of the rows extends oppositely to the tapering direction defined by any one of the conductive probes of the other one of the two of the rows, and any two of the long side surfaces respectively belonging to the two of the rows and adjacent to each other have a lateral interval there-between along a direction that is non-parallel to the arrangement direction;
wherein in the two of the rows of the conductive probes, the bottom surfaces define a central plane there-between, the central plane is parallel to the arrangement direction and is spaced apart from each of the bottom surfaces by the same distance, and the central plane does not pass through each of the conductive probes;
wherein each of the conductive probes has a total thickness in the tapering direction, and is spaced apart from the central plane by a spacing that is less than 5% of the total thickness.

* * * * *